United States Patent
Parris

(10) Patent No.: US 6,744,690 B1
(45) Date of Patent: Jun. 1, 2004

(54) ASYNCHRONOUS INPUT DATA PATH TECHNIQUE FOR INCREASING SPEED AND REDUCING LATENCY IN INTEGRATED CIRCUIT DEVICES INCORPORATING DYNAMIC RANDOM ACCESS MEMORY (DRAM) ARRAYS AND EMBEDDED DRAM

(75) Inventor: Michael C. Parris, Colorado Springs, CO (US)

(73) Assignees: United Memories, Inc., Colorado Springs, CO (US); Sony Corporation, Tokyo (JP)

( * ) Notice: Subject to any disclaimer, the term of this patent is extended or adjusted under 35 U.S.C. 154(b) by 0 days.

(21) Appl. No.: 10/289,736

(22) Filed: Nov. 7, 2002

(51) Int. Cl.[7] ................................................ G11C 8/00
(52) U.S. Cl. .............. 365/230.03; 365/233; 365/189.05
(58) Field of Search ............................ 365/230.03, 233, 365/189.05, 189.02, 189.01

(56) References Cited

U.S. PATENT DOCUMENTS 6,418,077 B1 * 7/2002 Naven ........................ 365/233

* cited by examiner

*Primary Examiner*—David Lam
(74) *Attorney, Agent, or Firm*—William J. Kubida; Hogan & Hartson LLP

(57) ABSTRACT

A non-clocked data-in path in an integrated circuit device incorporating a random access memory array allows data written to the array to ripple through to all banks all the way up to the local write circuitry. This allows for the fastest writes possible to the array since there are no additional clocking registers to slow down the data flow.

20 Claims, 5 Drawing Sheets

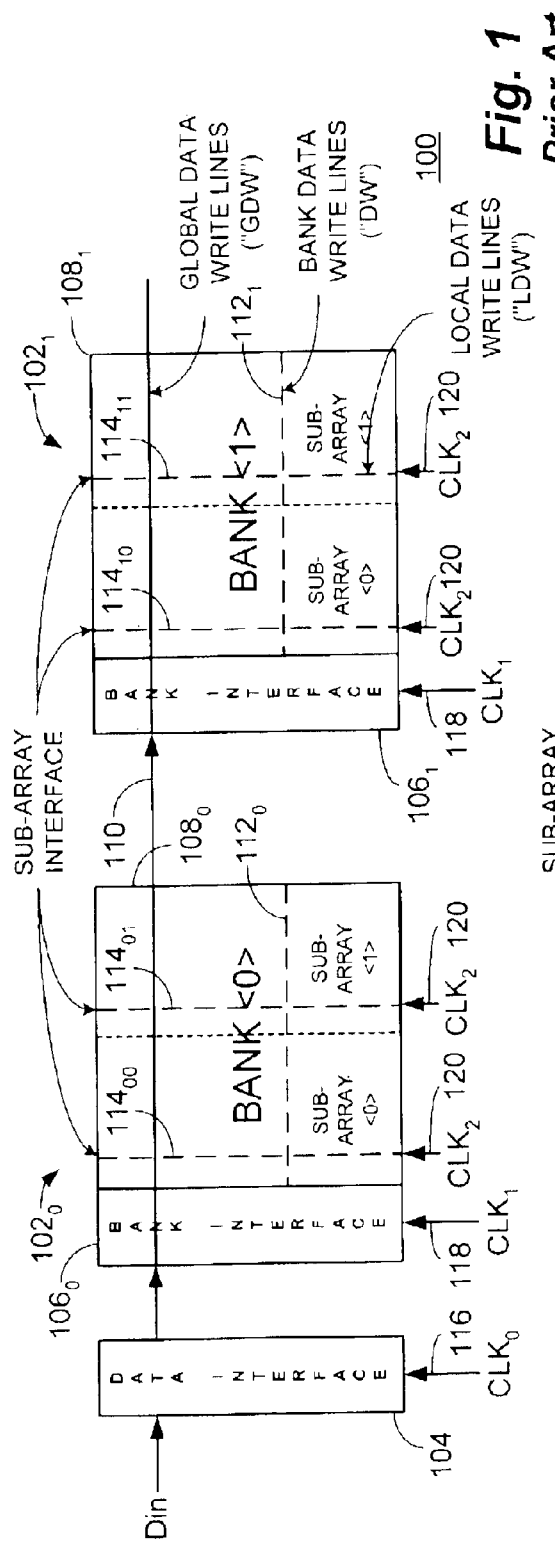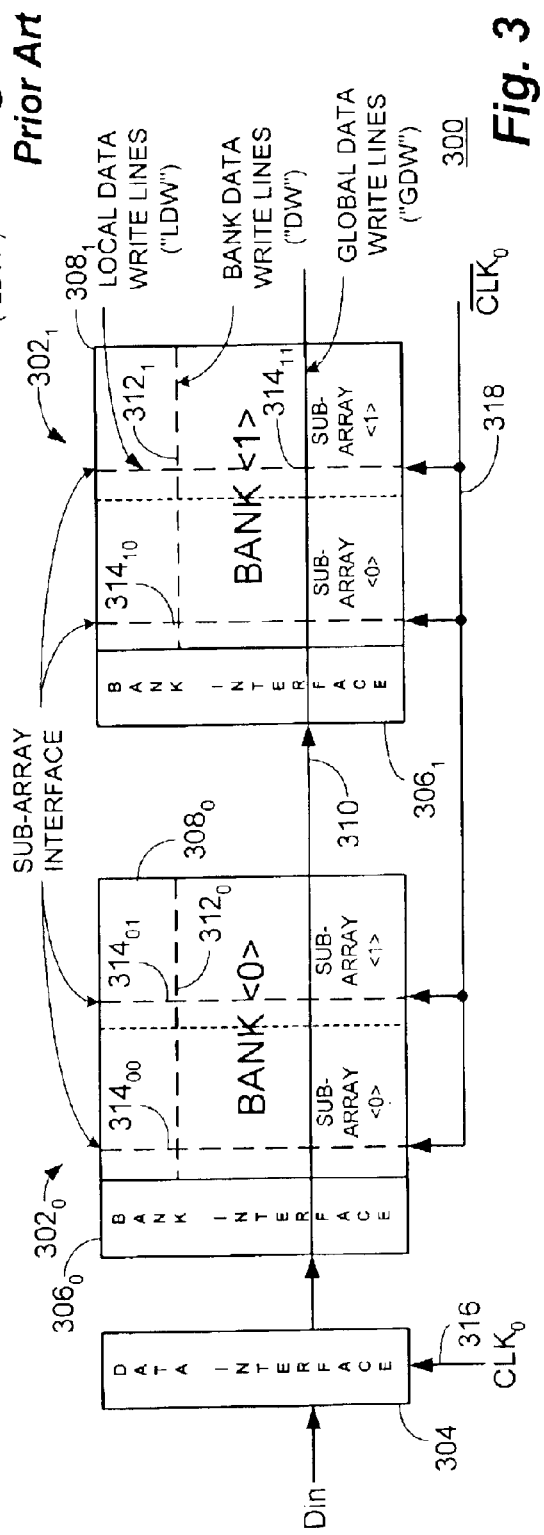

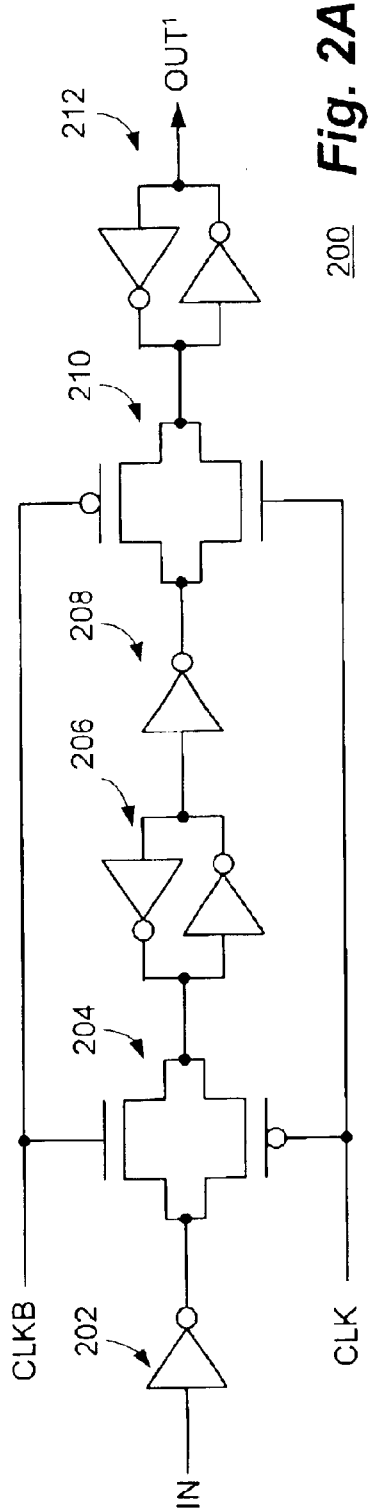
*Fig. 2A*
*Fig. 2B*
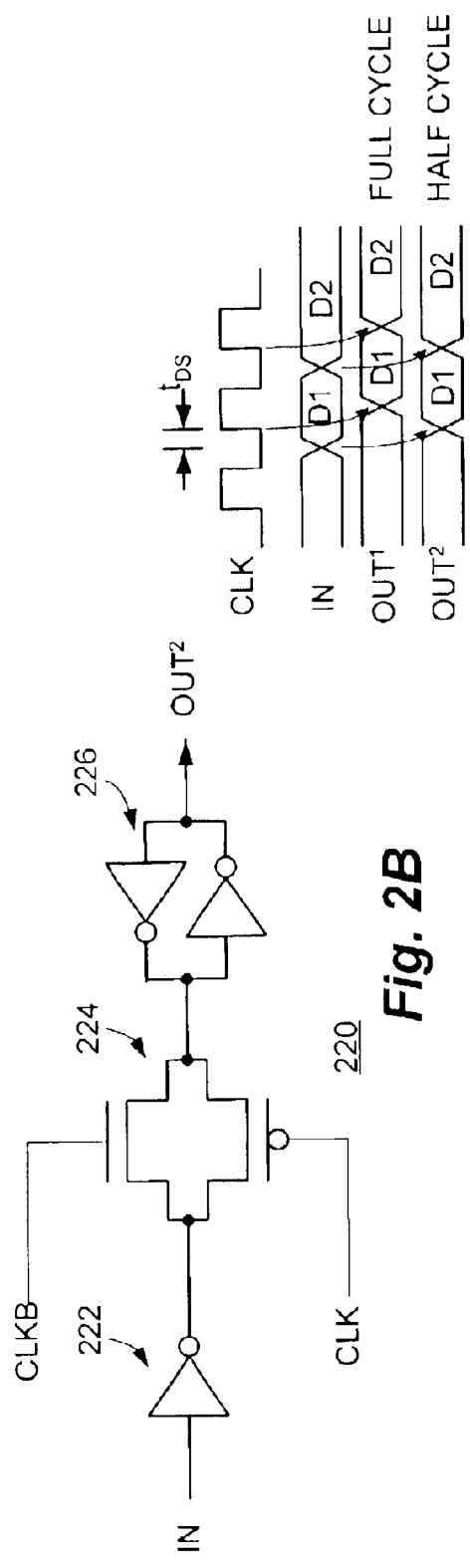
*Fig. 2C*

ASYNCHRONOUS INPUT DATA PATH TECHNIQUE FOR INCREASING SPEED AND REDUCING LATENCY IN INTEGRATED CIRCUIT DEVICES INCORPORATING DYNAMIC RANDOM ACCESS MEMORY (DRAM) ARRAYS AND EMBEDDED DRAM

BACKGROUND OF THE INVENTION

The present invention relates, in general, to the field of integrated circuit devices incorporating random access memory arrays. More particularly, the present invention relates to an asynchronous input data path technique of especial utility with respect to increasing speed and reducing latency in dynamic random access memory ("DRAM") arrays and those integrated circuit devices incorporating embedded DRAM.

Many types of DRAM based devices, or integrated circuits including embedded memory arrays, are currently available including extended data out ("EDO"), synchronous DRAM ("SDRAM"), double data rate ("DDR") DRAM and the like. Regardless of configuration, the primary purpose of the DRAM is to store data. Functionally, data may be written to the memory, read from it or periodically refreshed to maintain the integrity of the stored data. In current high density designs, each DRAM memory cell comprises a single pass transistor coupled to an associated capacitor that may be charged to store a value representative of either a logic level "1" or "0". Data stored in these memory cells may be read out and written to them through columns of sense amplifiers coupled to complementary bit lines interconnecting rows of these cells.

A typical integrated circuit memory array architecture comprises two or more banks of memory. Generally, data to be written to the memory is input to a data interface which incorporates a full cycle latch in order to capture the data on the rising (or falling) edge of a first internal clock signal. Adjoining the edge of each bank of the memory array there is usually another, second clocked stage which receives bank address information and controls multiplexing of the data into the desired bank. Since each of the banks of the array typically comprise further sub-arrays, a third clocking stage is generally employed at the interface to each individual sub-array.

By virtue of the fact that three separate clocking stages have been employed in current designs, an overall slow write-data path results which currently requires several clock cycles in order to pipe data into the desired sub-arrays of the overall memory array.

SUMMARY OF THE INVENTION

In accordance with the technique of the present invention, by allowing the data to ripple through the sub-arrays of the memory, the speed and latency of the data-in information can be improved. A non-clocked data-in path through each bank interface allows data written to the array to ripple through to all banks all the way up to the local write ("LWRITE") circuitry. This allows for the fastest writes possible since there are no additional clocking registers to slow down the data flow.

Particularly disclosed herein is an integrated circuit device including a memory array which comprises a plurality of memory banks forming at least a portion of the memory array. A clocked data interface receives data to be written to the memory array and is operative in response to a first clocking signal. A non-clocked bank interface is associated with each of the plurality of memory banks and at least one global data write line is in data communication between the data interface and the bank interface associated with each of the plurality of memory banks. At least one clocked sub-array interface is operative in response to a second clocking signal, and associated with each of the plurality of memory banks, with the clocked sub-array interface being in data communication with an associated non-clocked bank interface through at least one bank data write line.

Also disclosed herein is a method for supplying data to at least one global data write line in an integrated circuit device memory array. The method comprises: furnishing the data to a data interface of the memory array, allowing the data to pass through the data interface to the global data write line in response to a first state of a clocking signal and latching the data in the data interface in response to a second opposite state of the clocking signal.

Still further disclosed herein is a method for writing data to a memory array in an integrated circuit device. The method comprises: inputting data to a data interface, passing the data to at least one global data write line in response to a first state of a first clocking signal, latching the data in the data interface in response to a second state of the first clocking signal, coupling the global data write line to at least one bank data write line through a non-clocked bank interface and further coupling the bank data write line to at least one local data write line of the memory array in response to a second clocking signal.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIG. 1 is a simplified functional block diagram of a conventional synchronous DRAM "SDRAM" device architecture illustrating the use of three different phases (or half phases) of a clocking signal in order to effectively write data into the memory array;

FIG. 2A is a schematic illustration of a typical full cycle latch implementation wherein data may be both captured and released on the rising edge of a clock ("CLK") signal and the output ("OUT") does not change at any time other than the rising edge of CLK;

FIG. 2B is a corresponding schematic illustration of a typical half cycle latch in which data is free to move through the latch any time the CLK signal is "low" and data is latched in the circuit only when the CLK signal is "high";

FIG. 2C is a series of waveforms illustrating the functionality of the full cycle latch of FIG. 2A and the half cycle latch of FIG. 2B;

FIG. 3 is a comparative, simplified functional block diagram of an integrated circuit SDRAM device (or one incorporating embedded SDRAM) architecture incorporating an asynchronous input data path technique in accordance with the present invention wherein the traditional full cycle latch at the DRAM interface is replaced with a half cycle latch and the clocking of the bank interface removed in order to improve the speed of data in the path and reduce latency;

DESCRIPTION OF A REPRESENTATIVE EMBODIMENT

Figure 4:
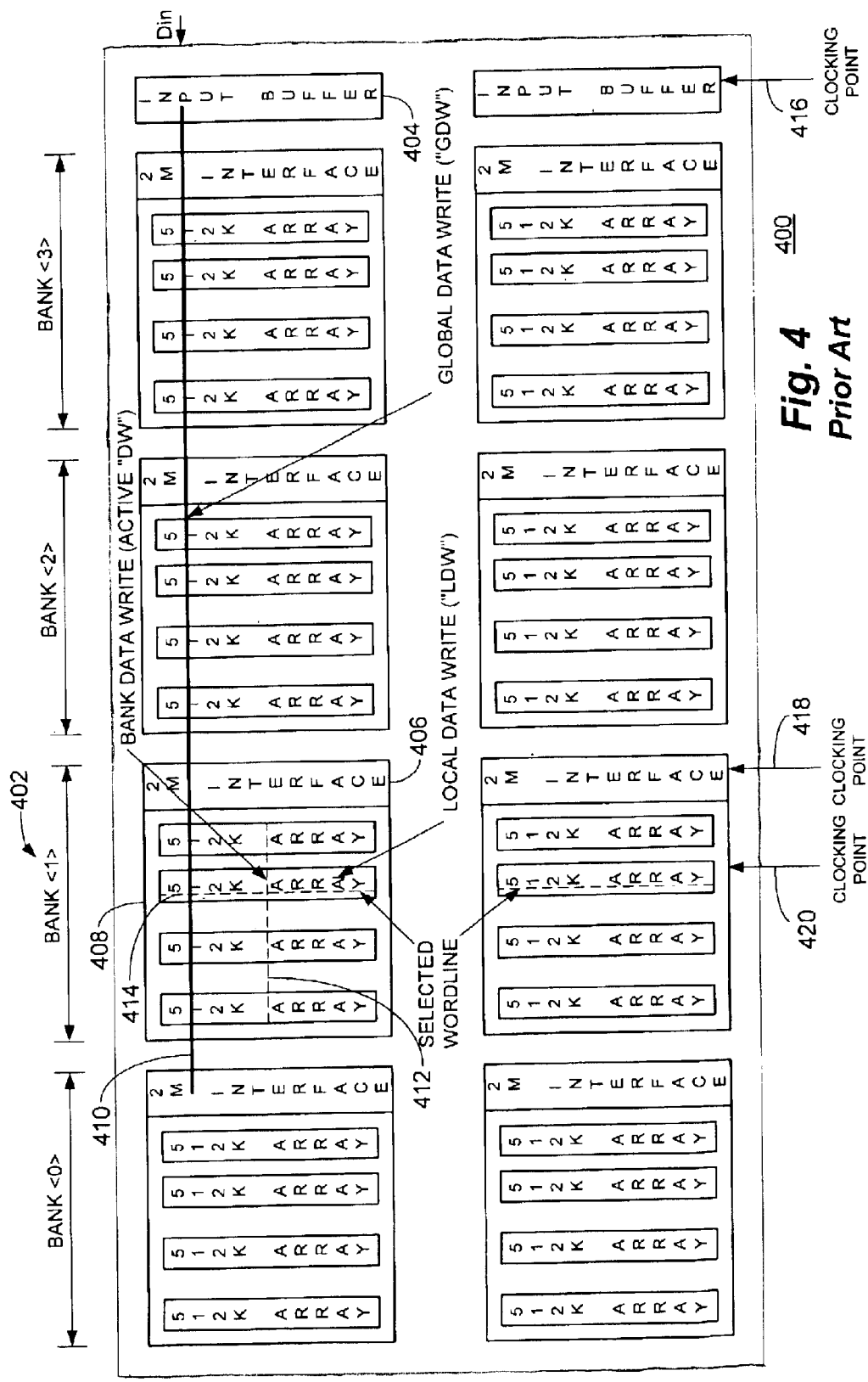
FIG. 4 is a further, more detailed functional block diagram of a conventional 16M SDRAM architecture incorporating a typical asynchronous data path and implementing a prior art clocking technique similar to that shown in FIG. 1.

With reference now to FIG. 1, a simplified functional block diagram of a conventional synchronous DRAM "SDRAM" device 100 architecture is shown. The device 100 requires the provision and use of three different phases (or half phases) of a clocking signal ("CLK") in order to effectively write data into the memory array comprising, in this representative illustration, banks $102_0$ and $102_1$, (BANK<0> and BANK<1> respectively).

The device 100 includes a data interface 104 for receiving the data to be written to the memory array on line Din. Each of the banks $102_0$ and $102_1$ includes a respective clocked bank interface $106_0$ and $106_1$ as shown. A number of memory arrays $108_0$ and $108_1$, each comprising a number of sub-arrays, together with the bank interfaces $106_0$ and $106_1$ form the device 100 memory array.

A global data write line ("GDW") 110 receives the data to be written to the memory banks $102_0$ and $102_1$ from the Din line and is coupled to each of the bank interfaces $106_0$ and $106_1$. As shown, each of the memory banks $102_0$ and $102_1$ has a respective bank data write line ("DW"; the complementary "DWB" lines are not shown) $112_0$ and $112_1$ respectively. Clocked sub-array interfaces, for example, local write ("LWRITE") drivers, are coupled to local date write lines ("LDW"; the complementary "LDWB" lines are not shown) $114_{00}$ through $114_{11}$ as illustrated.

In this conventional embodiment of a device 100, the data interface 104 is clocked by a $CLK_0$ signal on line 116 while the individual bank interfaces $106_0$ and $106_1$ are also clocked by a separate $CLK_1$ signal on respective lines 118. In addition, the sub-array interfaces coupled to the LDW lines $114_{00}$ through $114_{11}$ are also clocked by a third $CLK_2$ signal. Conventionally, the clock signals $CLK_0$, $CLK_1$ and $CLK_2$ are three different phases (or half phases) of the input clock (CLK) with $CLK_1$ having bank address information and $CLK_2$ having array select and bank address information. The bank interfaces $106_0$ and $106_1$ may also contain masking and repair logic and possibly double data rate ("DDR") synchronizing logic.

With reference additionally now to FIG. 2A, a schematic illustration of a typical full cycle latch 200 implementation is shown. The full cycle latch 200 comprises a first inverter 202 which is coupled to receive an input ("IN") signal and provide an inverted output to the input of a first complementary metal oxide semiconductor ("CMOS") pass gate 204. The first pass gate 204 is controlled by the CLK and complementary CLKB signals respectively applied to the corresponding gate terminals of the P-channel and N-channel devices thereof.

Output from the pass gate 204 is then supplied to a first latch 206 comprising a pair of cross-coupled inverters. The output of the first latch 206 is then inverted through a second inverter 208 and provided to the input of a second CMOS pass gate 210. The second pass gate 210 is also controlled by the CLKB and complementary CLK signals respectively applied to the corresponding gate terminals of the P-channel and N-channel devices thereof. Output from the second pass gate 210 is supplied to a second latch 212, and from the second latch 212 to an output to provide the signal "OUT$^1$". Typically, the feedback inverters of the first and second latches 206, 212 are "weaker" than that of the other corresponding inverter.

In operation, the full cycle latch 200 functions such that input data may be both captured and released on the rising edge of the CLK signal and the output does not change at any time other than on the rising edge of CLK. Differing implementations of a full cycle latch 200 may be provided, but the commonality among them all is that on the rising edge of the clock (or failing edge, in other circuits) data is both captured and released and their output does not change at any other time than on the rising (or falling) edge.

With reference additionally now to FIG. 2B, a corresponding schematic illustration of a typical half cycle latch 220 is shown. The half cycle latch 220 comprises an inverter 222 which is coupled to receive an input ("IN") signal and provide an inverted output to the input of a single CMOS pass gate 224. The pass gate 224 is also controlled by the CLK and complementary CLKB signals respectively applied to the corresponding gate terminals of the P-channel and N-channel devices thereof. Output from the pass gate 224 is then supplied to a latch 226 comprising a pair of cross-coupled inverters with output from the latch 226 providing the signal "OUT$^2$".

Functionally, the operation of the half cycle latch 220 is such that data is free to move through the latch 220 any time the CLK signal is "low" and data is latched in the circuit only when the CLK signal is "high".

With reference additionally now to FIG. 2C, a series of waveforms illustrating the functionality of the full cycle latch 200 of FIG. 2A and the half cycle latch 220 of FIG. 2B is shown. This waveform diagram shows the difference in output timing between a full cycle latch 200 and a half cycle latch 220 with the time period $t_{DS}$ being the data setup time.

With reference additionally now to FIG. 3, a comparative, simplified functional block diagram of an integrated circuit SDRAM device 300 (or one incorporating embedded SDRAM) architecture is shown. The device 300, in contrast to the device 100 of FIG. 1, requires the provision and use of but two half phases ($CLK_0$ and $/CLK_0$) of a clocking signal in order to effectively write data into the memory array comprising, in this representative illustration, banks $302_0$ and $302_1$ (BANK<0> and BANK<1> respectively).

The device 300 includes a data interface 304 for receiving the data to be written to the memory array on line Din. Each of the banks $302_0$ and $302_1$ includes a respective non-clocked bank interface $306_0$ and $306_1$ as shown. A number of memory arrays $308_0$ and $308_1$, each comprising a number of sub-arrays, together with the bank interfaces $306_0$ and $306_1$ form the device 300 memory array.

A global data write line ("GDW") 310 receives the data to be written to the memory banks $303_0$ and $302_1$ from the Din line and is coupled to each of the bank interfaces $306_0$ and $306_1$. As shown, each of the memory banks $303_0$ and $302_1$ has a respective bank data write line ("DW"; the complementary "DWB" lines are not shown) $312_0$ and $312_1$ respectively. Clocked sub-array interfaces, for example, local write ("LWRITE") drivers, are coupled to local date write lines ("LDW"; the complementary "LDWB" lines are not shown) $314_{00}$ through $314_{11}$ as illustrated.

In this representative embodiment of a device 100 in accordance with the present invention, the data interface 304 is clocked by a $CLK_0$ signal on line 316 while the individual bank interfaces $306_0$ and $306_1$ are not clocked. The sub-array interfaces coupled to the LDW lines $314_{00}$ through $314_{11}$ are also clocked by the complement of the $CLK0_2$ signal. Functionally, the device 300 then incorporates an asynchronous input data path technique wherein the traditional full cycle latch 200 (FIG. 2A) at the bank interface 106 (FIG. 1) is replaced with a half cycle latch 220 (FIG. 2B) and the clocking of the bank interface 306 removed in order to improve the speed of data in the path and reduce latency. Stated another way, by replacing the traditional full cycle latch at the bank interface with a half cycle latch and removing the clocking at the bank interface and using a half cycle latch (the other half of the DRAM interface latch) the latency and speed of the data in path can be much improved.

Consequently, the bank interface 306 can still contain data mask (as will be more fully described hereinafter) and data redundancy logic but no clocking or latch circuitry is required. By allowing the DW lines 112 to change and be valid for all the banks 102, the setup time of the Din information can be used to feed Din all the way through up to the sub-array interface 114. At this location, sub-array and bank addressing information can be combined with the opposite phase of the $CLK_0$ signal ($CLKB_0$ or $/CLK_0$) to gate the data into the proper sub-array. The technique of the present invention may be used in conjunction with DDR SDRAMs by, for example implementing the DDR synchronizing logic at the sub-array interface 306. Although somewhat more power may be consumed by the device 300 in simultaneously driving all of the bank LDW lines 114, (for example, in a four bank system only one bank is written at a time while the other three banks will have their LDW line 114 transitioning) this is generally an acceptable trade-off.

With reference additionally now to FIG. 4, a further, more detailed functional block diagram of a conventional 16M SDRAM 400 architecture incorporating a typical asynchronous data path is shown. For purposes of clarity, a single bank 402 (BANK<1> of four is labeled as representative of all others.

The SDRAM 400 includes an input buffer (or data interface) 404 coupled to a bank interface 406 and memory array 408 of each bank 402 by means of a GDW line 410. A DW line 412 and LDW line 414 are indicated. As with the device 100 (FIG. 1), the input buffer 404 is clocked at a first clocking point 416, each of the bank interfaces 406 are clocked at a second clocking point 418 and the sub-array interfaces are clocked at a third clocking point 420.

Figure 5:
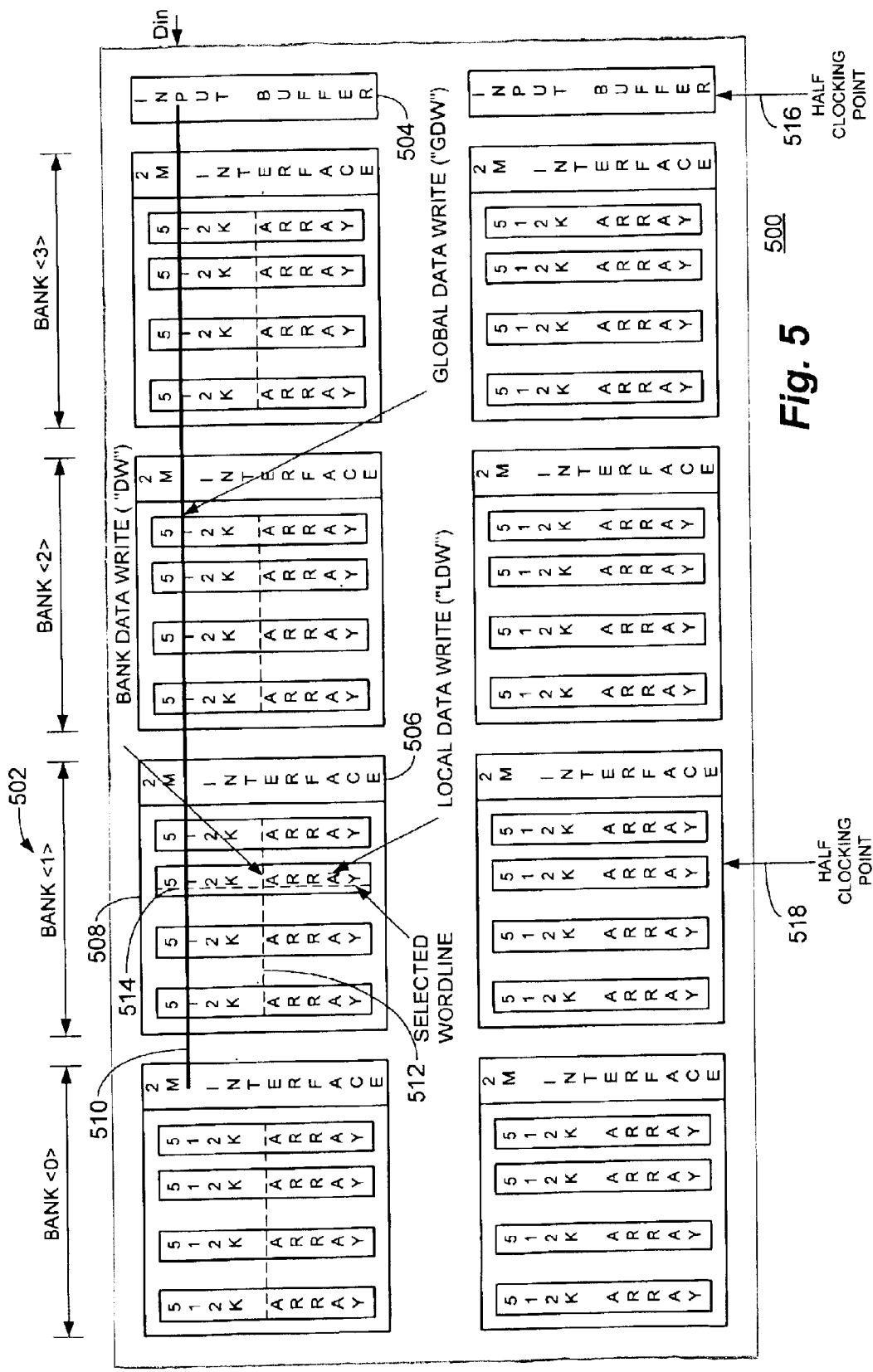
FIG. 5 is a comparative, more detailed functional block diagram of a 16M SDRAM architecture in accordance with the technique of the present invention illustrating a more specific implementation of the general approach illustrated in FIG. 3.

With reference additionally now to FIG. 5, a comparative, more detailed functional block diagram of a 16M SDRAM 500 architecture in accordance with the technique of the present invention is shown and which illustrates a more specific implementation of the general approach of the present invention as previously described with respect to FIG. 3. Again, for purposes of clarity, a single bank 502 (BANK<1> of four is labeled as representative of all others.

The SDRAM 500 also includes an input buffer (or data interface) 504 coupled to a bank interface 506 and memory array 508 of each bank 502 by means of a GDW line 510. A DW line 512 and LDW line 514 are indicated. As with the device 300 (FIG. 3), the input buffer 404 is clocked at a first half clocking point 516 while none of the bank interfaces 506 are clocked. At a second half clocking point 518, the sub-array interfaces are clocked.

Figure 6:
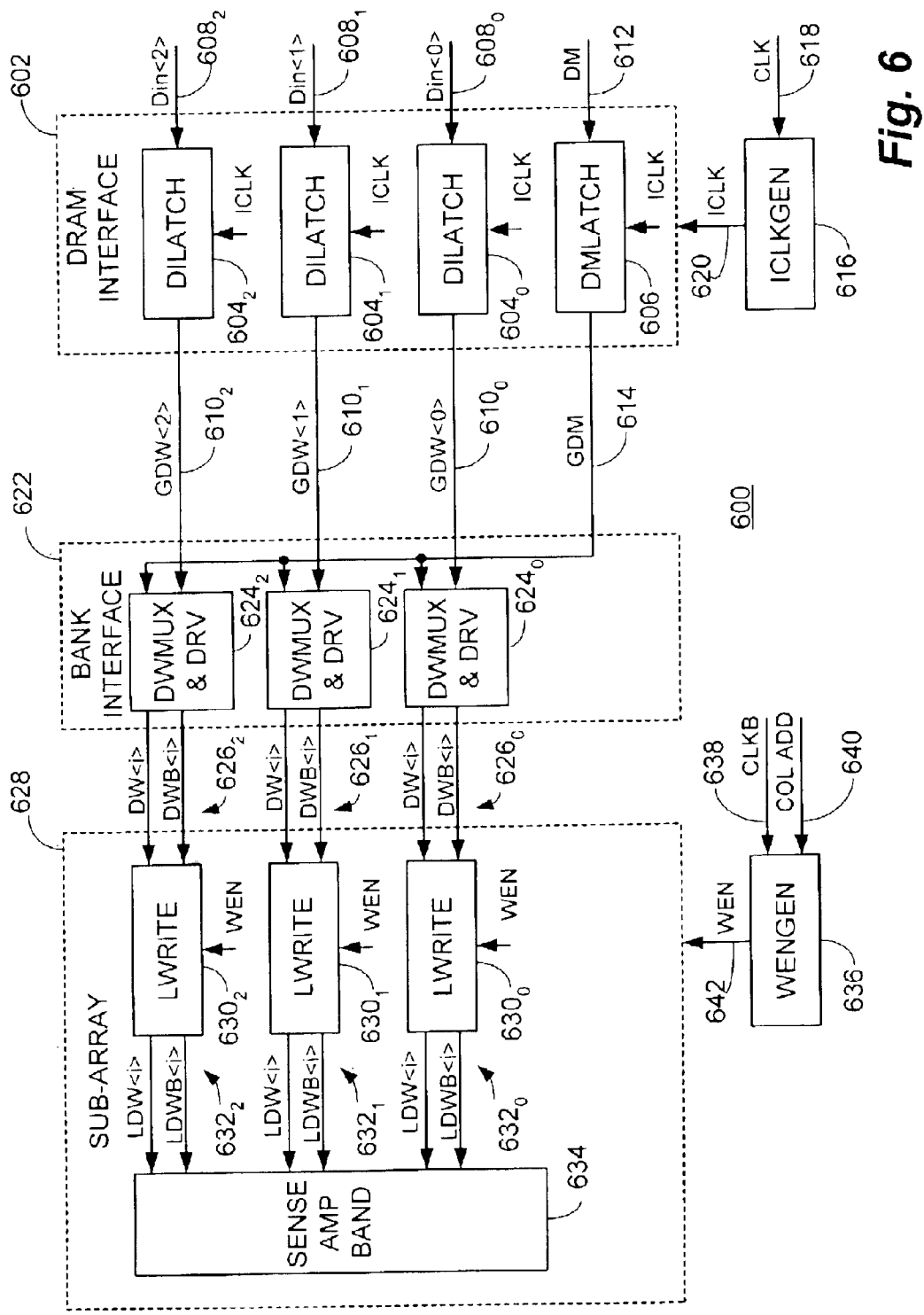
FIG. 6 is a high level functional block diagram of an integrated circuit memory device in accordance with the technique of the present invention illustrating the write data paths and derivation of the internal clock ("ICLK") and write enable ("WEN") signals from the system "CLK" and complementary "CLK" signals.

With reference additionally now to FIG. 6, a high level functional block diagram of an integrated circuit memory device 600 in accordance with the technique of the present invention is shown. In this view, the write data paths and derivation of the internal clock ("ICLK") and write enable ("WEN") signals from the system "CLK" and complementary "CLKB" signals is illustrated.

The memory device 600 includes a DRAM interface 602 (corresponding to the data interface 304 and input buffer 504 of FIGS. 3 and 5 respectively) comprising a number of data in latches ("DILATCH") $604_0$ through $604_2$ each respectively coupled to a corresponding data input line $606_0$ through $606_2$ (Din<0> through Din<2>). Output of the DILATCHs $604_0$ through $604_2$ is each respectively coupled to a corresponding global data write line $610_0$ through $610_2$ (GDW<0> through GDW<2>) The DRAM interface 602 further includes a data mask latch ("DMLATCH") 606 coupled to receive a data mask ("DM") signal on line 612 and provide a global data mask ("GDM") signal on line 614. An internal clock generator ("ICLKGEN") 616 receives an input clock signal ("CLK") on line 618 and provides an ICLK signal on line 620 to the DILATCHs $604_0$ through $604_2$ and DMLATCH 606 as indicated.

The memory device 600 further includes a bank interface 622 which comprises data write multiplexers and drivers ("DWMUX & DRV") $624_0$ through $624_2$. The data write multiplexers and drivers $624_0$ through $624_2$ are coupled to the corresponding one of the global data write line $610_0$ through $610_2$ as well as to receive GDM signal on line 614. The data write multiplexers and drivers $624_0$ through $624_2$ provide complementary bank data write ("DW" and "DWB") signals on line pairs $626_0$ through $626_2$ respectively.

These signals are then input to corresponding local write drivers ("LWRITE") $630_0$ through $630_2$ of a sub-array interface 628. The LWRITE drivers $630_0$ through $630_2$, in turn, provide complementary local data write ("LDW" and "LDWB") signals on line pairs $632_0$ through $632_2$ respectively for input to a sense amplifier band 634 of the memory array. A write enable generator ("WENGEN") 636 receives a complementary input clock signal ("CLKB") on line 638 as well as a column address ("COL ADD") signal on line 640. The WENGEN 636 provides a write enable ("WEN") signal on line 642 to the LWRITE drivers $630_0$ through $630_2$ as indicated.

While there have been described above the principles of the present invention in conjunction with specific implementations of memory devices, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. An integrated circuit device including a memory array comprising:
   a plurality of memory banks forming at least a portion of said memory array;
   a clocked data interface for receiving data to be written to said memory array and operative in response to a first clocking signal;
   a non-clocked bank interface associated with each of said plurality of memory banks;
   at least one global data write line in data communication between said data interface and said bank interface associated with each of said plurality of memory banks; and
   at least one clocked sub-array interface operative in response to a second clocking signal and associated with each of said plurality of memory banks, said at least one clocked sub-array interface being in data communication with an associated non-clocked bank interface through at least one bank data write line.

2. The integrated circuit device of claim 1 wherein said plurality of memory banks comprise dynamic random access memory cells.

3. The integrated circuit device of claim 1 wherein said plurality of memory banks are arranged in a substantially linear relationship with respect to said clocked data interface.

4. The integrated circuit device of claim 1 wherein said clocked data interface comprises at least one data latch coupled to said at least one global data write line for retaining said data.

5. The integrated circuit device of claim 4 wherein said at least one data latch comprises a half latch.

6. The integrated circuit device of claim 1 wherein said clocked data interface further comprises:
   a data mask latch coupled to receive a data mask signal input; and
   a global data mask coupled between said data mask latch and said non-clocked bank interface.

7. The integrated circuit device of claim 6 wherein said data mask latch comprises a half latch.

8. The integrated circuit device of claim 1 wherein said non-clocked bank interface comprises:
   at least one bank data write line driver coupling said at least one global data write line to said at least one bank data write line.

9. The integrated circuit device of claim 8 wherein said at least one bank data write line driver further comprises:
   a multiplexer having inputs thereof coupled to said at least one global data write line and a global data mask line.

10. The integrated circuit device of claim 1 wherein said at least one clocked sub-array interface comprises:
    at least one local write driver coupling said at least one bank data write line to at least one local data write line.

11. The integrated circuit device of claim 10 wherein said at least one local write driver is operative in response to a write enable signal.

12. The integrated circuit device of claim 11 wherein said write enable signal is derived from a complement of said first clocking signal.

13. The integrated circuit device of claim 12 wherein said write enable signal is further derived from a column address signal.

14. The integrated circuit device of claim 1 wherein said first clocking signal is derived from an external clocking signal.

15. A method for supplying data to at least one global data write line in an integrated circuit device memory array comprising:
    furnishing said data to a data interface of said memory array;
    allowing said data to pass through said data interface to said global data write line in response to a first state of a clocking signal; and
    latching said data in said data interface in response to a second opposite state of said clocking signal.

16. The method of claim 15 wherein said step of furnishing comprises:
    inputting said data to said data interface on a data input line.

17. The method of claim 15 wherein said steps of allowing and latching said data are carried out by a half latch circuit.

18. A method for writing data to a memory array in an integrated circuit device comprising:
    inputting data to a data interface;
    passing said data to at least one global data write line in response to a first state of a first clocking signal;
    latching said data in said data interface in response to a second state of said first clocking signal;
    coupling said at least one global data write line to at least one bank data write line through a non-clocked bank interface; and
    further coupling said at least one bank data write line to at least one local data write line of said memory array in response to a second clocking signal.

19. The method of claim 18 wherein said second clocking signal is a complement of said first clocking signal.

20. The method of claim 18 wherein said second clocking signal is derived from said first clocking signal and a column address signal of said memory array.

* * * * *